United States Patent [19]

Lee

[11] Patent Number: 4,827,870
[45] Date of Patent: May 9, 1989

[54] APPARATUS FOR APPLYING MULTILAYER OPTICAL INTERFERENCE COATING ON COMPLEX CURVED SUBSTRATES

[75] Inventor: James C. Lee, Plymouth, Minn.

[73] Assignee: Honeywell Inc., Minneapolis, Minn.

[21] Appl. No.: 104,610

[22] Filed: Oct. 5, 1987

[51] Int. Cl.⁴ .............................................. B05C 11/00
[52] U.S. Cl. .................... 118/665; 118/50.1; 118/620; 118/728; 427/38; 427/164; 427/296; 427/255.6
[58] Field of Search ...................... 118/665, 620, 50.1, 118/728; 427/38, 164, 296, 255.6

[56] References Cited

U.S. PATENT DOCUMENTS

| | | | |
|---|---|---|---|
| 3,871,739 | 3/1975 | Poulsen | 350/1 |
| 3,953,652 | 4/1976 | Addiss, Jr. et al. | 428/412 |
| 4,096,315 | 6/1978 | Kubacki | 428/412 |
| 4,152,478 | 5/1979 | Takagi | 428/221 |
| 4,237,183 | 12/1980 | Fujiwara et al. | 428/336 |
| 4,579,639 | 4/1986 | Enomoto et al. | 204/192 N |
| 4,652,467 | 3/1987 | Brinker et al. | 427/246 |

*Primary Examiner*—Bernard Pianalto
*Attorney, Agent, or Firm*—John G. Shudy, Jr.

[57] ABSTRACT

Precision multilayer optical interference coating of substrates having complex topology using complementary shaped electrodes and plasma enhanced chemical vapor deposition within a chamber. The materials for the optical quality thin films are obtained from starting reactants of the form M-R where M denotes a metal atom and R denotes an organic component. These starting reactants are brought into a reactive atmosphere of the chamber through a plurality of orifices in one of the shaped electrodes. The resulting substances are deposited as thin films upon the substrates.

17 Claims, 6 Drawing Sheets

BASIC PLASMA CHEMICAL VAPOR DISPOSITION SYSTEM

SINGLE VISOR ELECTRODE SYSTEM

Fig. 3

DOUBLE VISOR ELECTRODE SYSTEM

Fig. 4

MULTI LENS FLAT PLATE ELECTRODE SYSTEM

Fig. 5

MULTI LENS TOROIDAL ELECTRODE SYSTEM

Fig. 6

MULTI EYE SHIELD TOROIDAL ELECTRODE SYSTEM

*Fig. 7*

SIDEVIEW OF A SINGLE LAYER PLASMA
POLYMERIZED HMDS

Fig. 8

SIDEVIEW OF A SINGLE LAYER PLASMA
POLYMERIZED TETRAMETHYLTIN
ON GLASS

Fig. 9

SIDEVIEW OF A 167 LAYER PLASMA POLYMERIZED FILM. THIS FILM PROVIDES AN O.D. OF 3 AT TWO REJECTION WAVELENGTHS.

*Fig. 10*

APPARATUS FOR APPLYING MULTILAYER OPTICAL INTERFERENCE COATING ON COMPLEX CURVED SUBSTRATES

Development of the present invention was partially funded under Contract No. DAMD17-83-C-3043 With the U.S. Army.

BACKGROUND OF THE INVENTION

1. Field of the Invention

The present invention pertains to coating substrates and particularly to coating curved substrates. More particularly, the invention pertains to the application of multilayer optical interference coatings to curved polymeric substrates.

2. Related Art

Other approaches in the art involve surface treatment and coating processes which are primarily for non-optical purposes. None of the related art known to the applicant uses shaped electrode geometry for precision coating of substrates of complex topology.

The fundamental problem in applying high performance optical interference coatings (OICs) using conventional coating materials (such as $MgF_2$, $SiO_2$, $TiO_2$, etc.) to optical quality polymers (such as polycarbonate, CR-39, i.e., a specific resin, acrylic, etc.) is the basic physical property mismatches and incompatibilities between the inorganic coating materials and the organic substrate. The difference in the temperature dependent thermal expansion coefficient is particularly acute leading to very high levels of stress in such conventional coatings developed in only a few layers. Layer counts of about twenty are the practical limit for such coatings, which limits performance and design flexibility in many applications. The present invention circumvents this problem by permitting coating designs of several hundred layers to be applied to polymeric substrates of nearly any arbitrary geometry.

SUMMARY OF THE INVENTION

The present invention is an apparatus and method for applying high performance multilayer optical interference coatings to polymeric substrates of complex curved topography, such as Army specification designed helicopter pilot visors to provide eye protection from laser weapons. The visors or other polymeric substrates are coated by plasma enhanced chemical vapor deposition (PECVD). The polymeric substrates are loaded into the reaction zone of the deposition apparatus. Vacuum pumps are used to "outgas" the substrates. Deposition materials are then introduced into the reaction zone along with an inert carrier gas and reactive agents. Excitation of the plasma allows chemical and thin film forming processes to occur which would normally be thermodynamically impossible at low temperatures. The starting reactant has the form M-R (i.e., a general description for the organo-metallic class of molecules) where M is a metal and R is an organic component.

Figure 2:
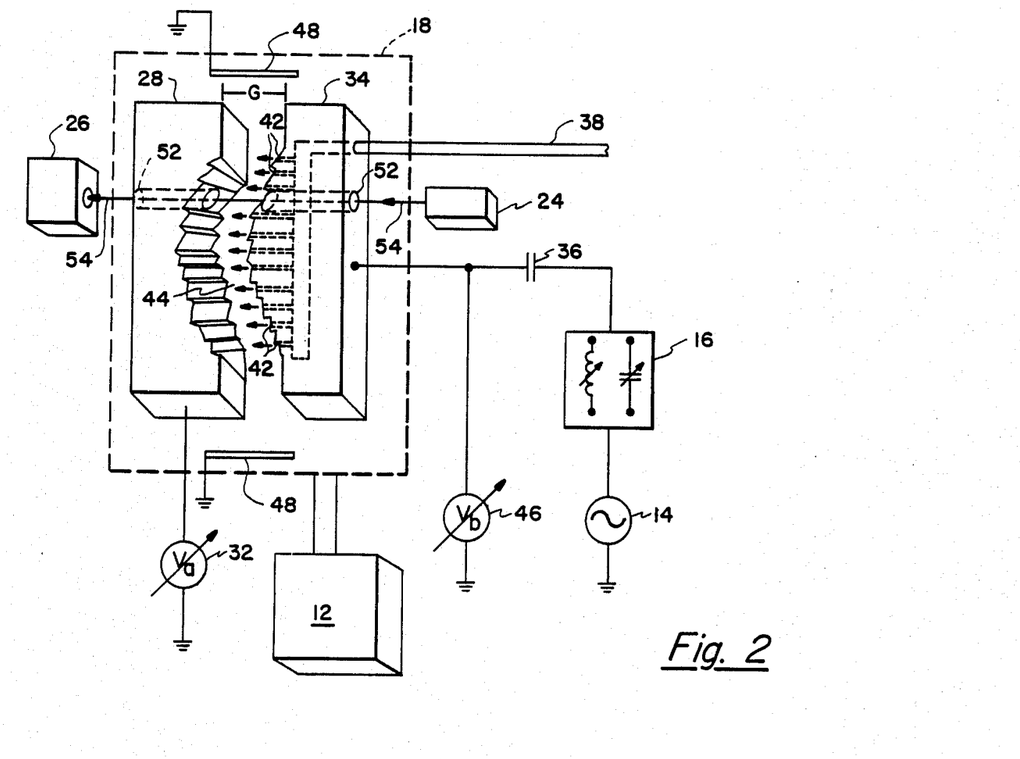
FIG. 2 is a detailed illustration of the electrode assembly.

A feature of the invention is the electrode/reactant feed structure for coating parts of complex geometry. FIG. 2 shows a passive electrode, biased by its own power supply, which is machined to fit and accommodate the polymeric substrate. A driven electrode is complementary to the contour on the passive electrode and is separated therefrom by a gap in which the plasma reaction occurs and where the substrate is placed. A reactant feed tube transports reactants through the driven electrode to the gap or reaction chamber. The device includes side shields to confine the plasma in the gap or reaction zone. An optical monitor is used to measure the thickness of the deposition.

An advantage of the invention is achieved by a unique deposition apparatus design employing shaped electrode geometry which enables objects of complex topology to be coated with thin films having thickness uniformity tolerances within a few percent of the wavelength of visible light, over the coated surface of the object.

Another advantage is that the invention, with the use of various material mixtures, can produce sophisticated optical interference coatings having a continuous gradient index variation, as well as the conventional discrete index interface multilayer type.

DESCRIPTION OF THE PREFERRED EMBODIMENT

Figure 1:
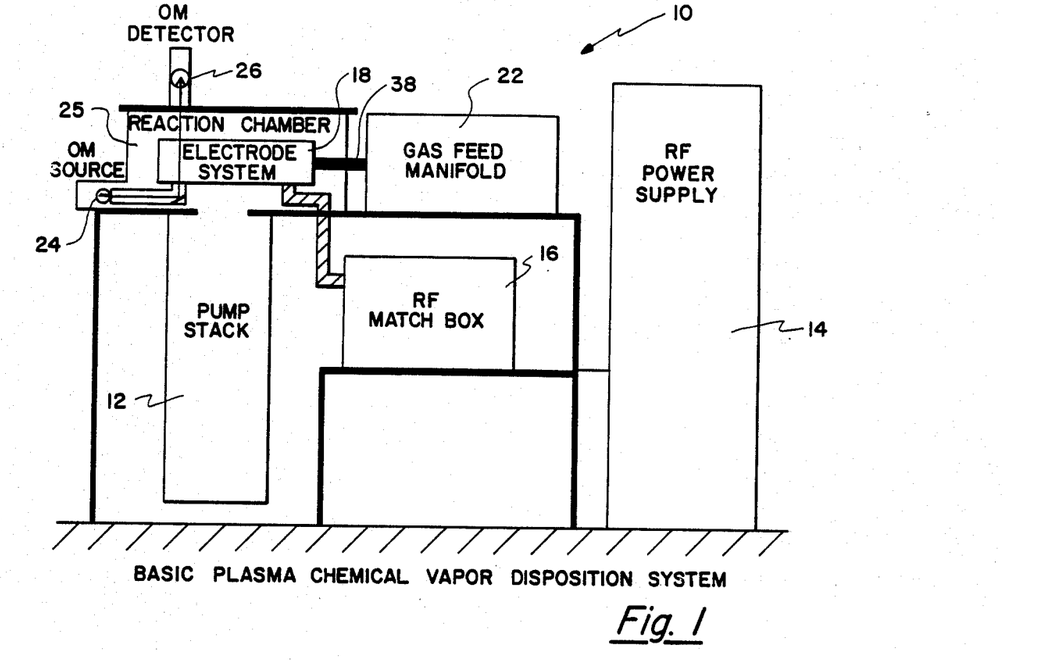
FIG. 1 is a cutaway diagram of the invention.

FIG. 1 shows the basic components of a plasma enhanced chemical vapor deposition (PECVD) reactor 10. Container 25 houses an optical monitor and chamber 18. There is a pump stack or vacuum pumping system 12 for evacuating reaction chamber or zone 18 of outgas parts and achieving operating pressures for the establishing a process plasma. Pumping system 12 is connected to reaction chamber 18 with a pipe means between pump 12 and chamber 18 for enabling the evacuation of certain matter or gases from chamber 18. Within chamber 18 are two electrodes 28 and 34. Between electrodes 28 and 34 is a space or zone 44 where the item to be coated is placed and a deposition process occurs. Radio frequency (RF) power supply 14 and impedance matching network 16 drive electrodes 28 and 34 to establish a plasma to promote chemical reactions involving M-R components to allow the formation of a high quality thin film. Electrode 34 is a driven electrode whereas electrode 28 is a passive electrode. Power supply 14, via network 16, has one terminal connected to electrode 34 and another terminal connected to electrode 28 via a ground or reference voltage. Gas and reactant feed manifold 22 is for monitoring and feeding reactants to plasma reactor zone 44. Gas and reactant substances are supplied to chamber 18 through pipe 38 from gas feed manifold 22. Pipe 38 connects gas feed manifold 22 to electrode 34 having pores through which gas and reactants enter zone 44. The gap or zone 44 is the space between electrodes 28 and 34 where the plasma, reaction and coating occur. The optical monitor (OM) instrument is within container 25. The OM, having an OM source 24 and OM detector 26, precisely monitors the thin film optical thickness, with a beam of light going from source 24 into chamber 18, through tunnel 52 of the electrodes 28 and 34, through the coated object, and to detector 26, thus allowing the fabrication of precisely tuned multilayer optical interference coatings.

Vacuum pumping system 12, power supply 14, impedance matching network 16 and feed manifold 22 are standard components readily available in the market place, and are common to several plasma reactor designs commercially available from several manufacturers. Such designs include the center-pumped flat plate reactor which is widely used to deposit silicon nitride passivation layers in the semiconductor industry.

The optical interference instrument comprising source 24 and detector 26 is a specialized component not commonly used with chemical vapor deposition processes of any sort, but often used in conventional physical vapor deposition of optical interference coatings. These devices are available from several companies including Eddy Co. of Lafayette, Calif., and Ballers of Liechtenstein.

Electrode and reactant feed structure 18 is a novel aspect of the reactor design and invention which allows the application of plasma enhanced chemical vapor deposited thin film to complex shaped parts. FIG. 2 illustrates the components of electrode and reactant feed structure 18. Electrode 28 is passive and specially machined into a shape to accommodate a portion of a three dimensional contour, i.e., $C(\bar{r})$, where $C(\bar{r})$ is a function of a radius describing the profile of a part to be coated, relative to a convenient coordinate system. The substrate item to be coated may be placed on electrode 28 having a convex shape for coating the item's convex side or on an electrode 28 having a concave shape for coating the item's concave side. Electrode 28 in FIG. 2 has a concave shape. Electrode 28 is made of electrically conducting material and can be biased, as needed to enhance coating, with a positive or negative electrical potential (at voltage $V_a$) relative to electrical ground. A passive electrode bias power supply 32 provides bias voltage $V_a$ as required. $V_a$ is typically equal to zero volts and thus electrode 28 is at the potential of the system reference or electrical ground point.

Driven electrode 34 is driven by RF power supply 14 together with impedance matching network 16 through a capacitor 36. Capacitor 36 is for coupling the RF power while blocking direct current (DC) power. Driven electrode 34 has a three dimensional contour $-C(\bar{r})$ which is complementary to the contour of passive electrode 28. Driven electrode 34 is separated from passive electrode 28 by a gap of distance G. Distance G is typically from five to ten centimeters and the plasma reactor 10 is operated in the one to two hundred millitorr pressure range.

Driven electrode 34 is connected to reactant manifold 22 via reactant feed tube 38 made of an electrically insulating material. The reactants diffuse through strategically placed delivery orifices or jets 42 in the driven electrode 34 into the interelectrode reaction zone 44. The placement of jets 42 is such that uniform coating thickness is achieved over contour $C(\bar{r})$.

Bias power supply 46 independently and electrically biases driven electrode 34 at $V_b$ ranging from zero to negative one hundred volts DC.

Electrostatic side shields 48 serve to confine the plasma in gap zone 44 between electrodes 28 and 34. Side shields 48 effectively form Faraday cage. Side shields 48 are made of a conducting material and are normally held at an electrical ground potential. The use of shields 48 considerably improves the efficiency of the deposition process. In other words, a pair of shields 48 cause reactant utilization to form thin films preferentially on the substrate rather than on extraneous wall areas.

Access tunnel 52 goes through electrodes 28 and 34, tunnel 52 of both electrodes 28 and 34 being aligned and allowing probe light beam 54 from optical monitor source 24 to be transmitted through the substrate being coated and on to detector 26 which measures the amount of light beam 54 transmitted thereby resulting in an indication of the amount of coating on the substrate.

Figure 3:
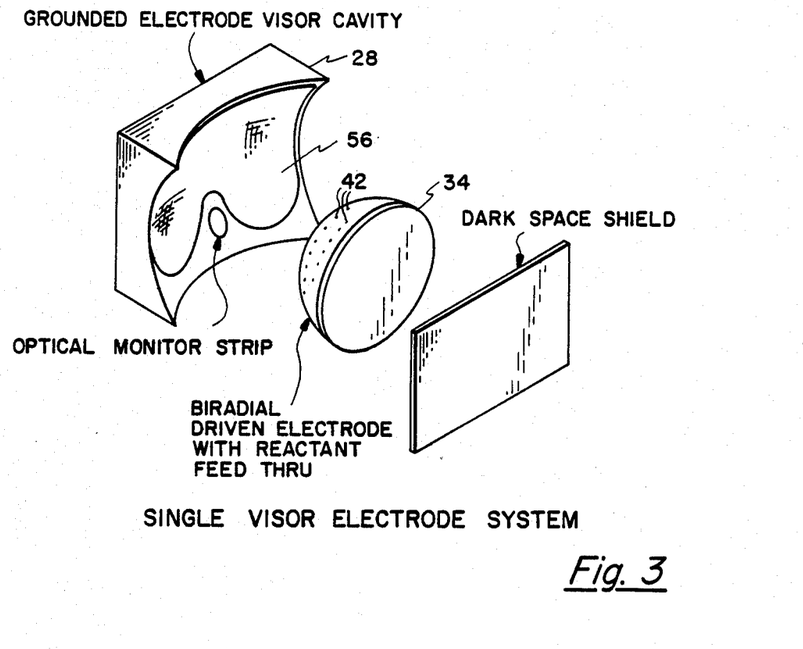
FIG. 3 is a perspective of an actual electrode system for coating a single visor.
Figure 4:
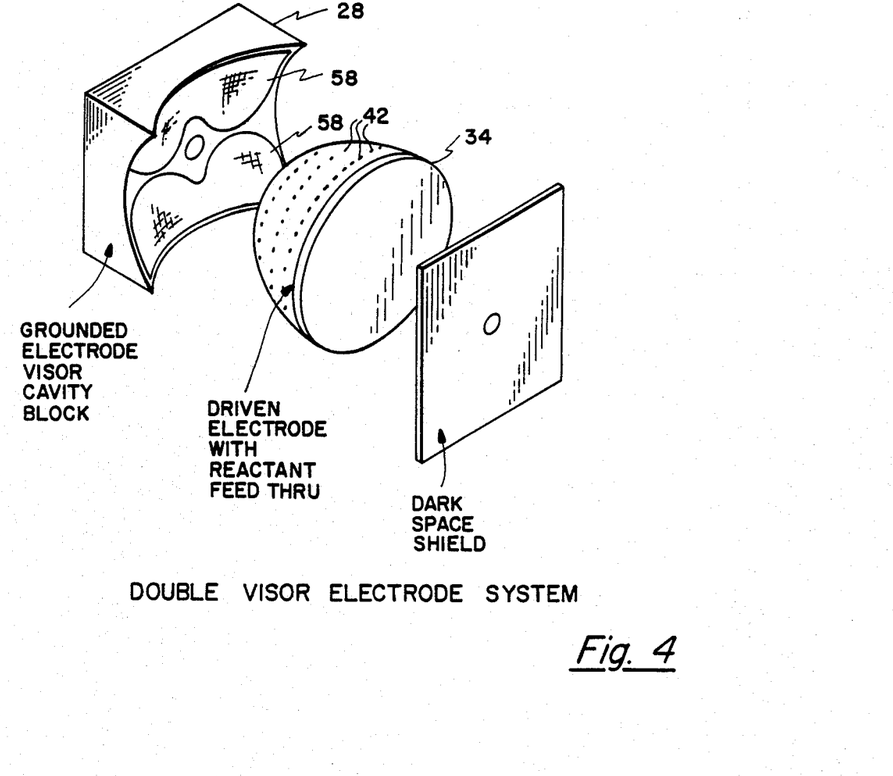
FIG. 4 is an illustration of an electrode system for coating two visors.

FIG. 3 shows electrodes 28 and 34 having contours designed for accommodating the coating of the biradially curved inside surface of aviator visor 56. Similarly, FIG. 4 shows electrodes 28 and 34 designed for simultaneously coating two visors 58.

Figure 5:
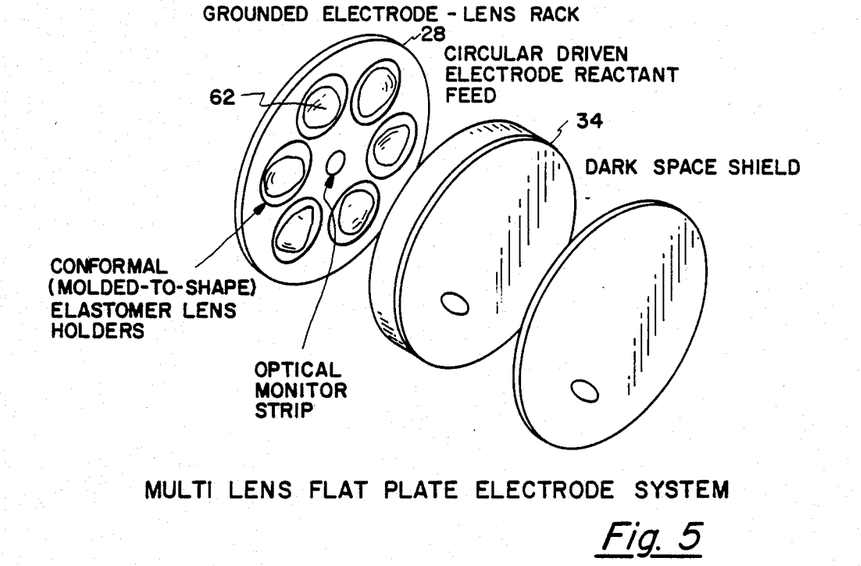
FIG. 5 shows a multi-lens flat plate electrode system.
Figure 6:
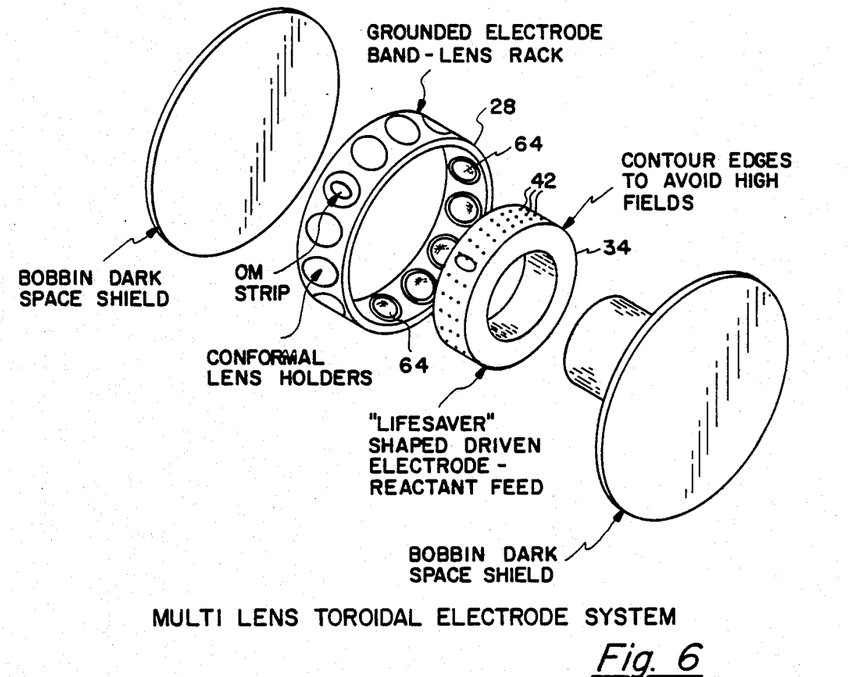
FIG. 6 shows a multi-lens toroidal electrode system.
Figure 7:
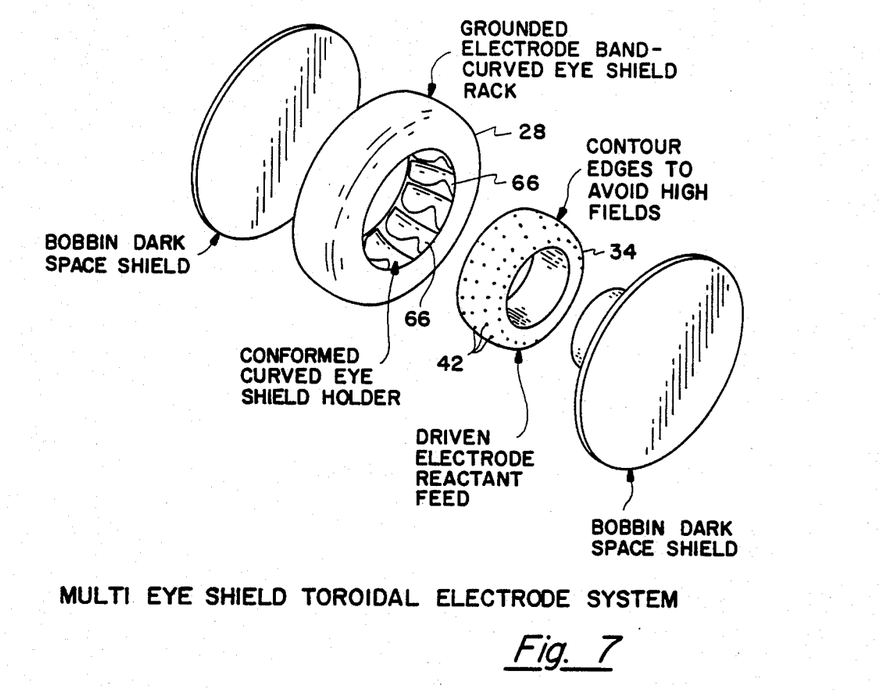
FIG. 7 shows a multiple eye shield toroidal electrode system.

FIG. 5 illustrates a multi-lens batch coating system having electrodes 28 and 34 designed for multiple lens 62 batch coatings. FIG. 6 shows toroidal shaped electrodes 28 and 34 for multiple lens 64 batch coatings. FIG. 7 similarly shows toroidal shaped electrodes 28 and 34 for multiple eye shield 66 batch coatings.

In the method of plasma enhanced chemical vapor deposition, the parts to be coated are loaded into reaction zone 44 (FIG. 2) of deposition apparatus or plasma reactor 10 (FIG. 1). Vacuum pumps 12 are incorporated in apparatus 10 to thoroughly out-gas the polymeric substrate in a typical process cycle of $10^{-6}$ torr $\times 2$ hours at room temperature. Deposition materials are then introduced into reaction zone 44 along with inert carrier gases (such as Xe or Ar) and appropriate reactive agents (for example, oxidizers $O_2$ or $N_2O$, or reducing agents like $H_2$). The reactant flows and reaction zone 44 pressures are then set (with typical flows in the one to ten standard cubic centimeters per minute (SCCM) range and pressures in the $10^{-3}$ to $10^{-2}$ torr range for a 0.5 to 1.0 cubic meter reactor zone 44 volume) prior to exciting a plasma (by an electrical discharge) in reactor zone 44. The excitation of the plasma allows chemical and physical thin film forming processes to occur which otherwise would be thermodynamically impossible at low process temperatures (typically in the 20 to 100 degree Centigrade range). The reason for such process occurrences is that the activation energy for these process is provided collisionally and through charge exchanges, rather than thermally (i.e., through kT energy).

The materials for optical quality thin films may be obtained from starting reactants of the form

M—R where M denotes a metal atom (e.g., Ti, Zn or Sn) and R denotes an organic component (such as from an alkyl or alkoxide group). By adjusting plasma reactor 10 parameters, films deposited from these reactants in a reactive (oxidative) atmosphere may have physical properties ranging from the purely organic to the purely inorganic, depending upon the relative proportion of M (i.e., the inorganic phase, usually incorporated as $MO_x$, a metal oxide) and R (i.e., the organic phase). These materials and system 10 make for an ideal application of high performance optical films well matched to the physical and chemical properties of polymeric substrates.

Figure 8:
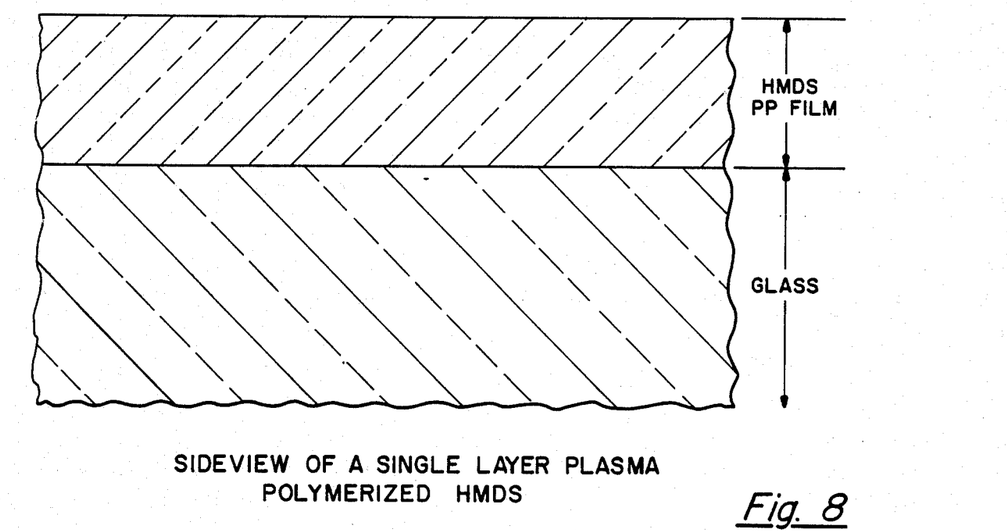
FIG. 8 is a side view of a single layer plasma polymerized hexamethyldiscloxane film on glass.
Figure 9:
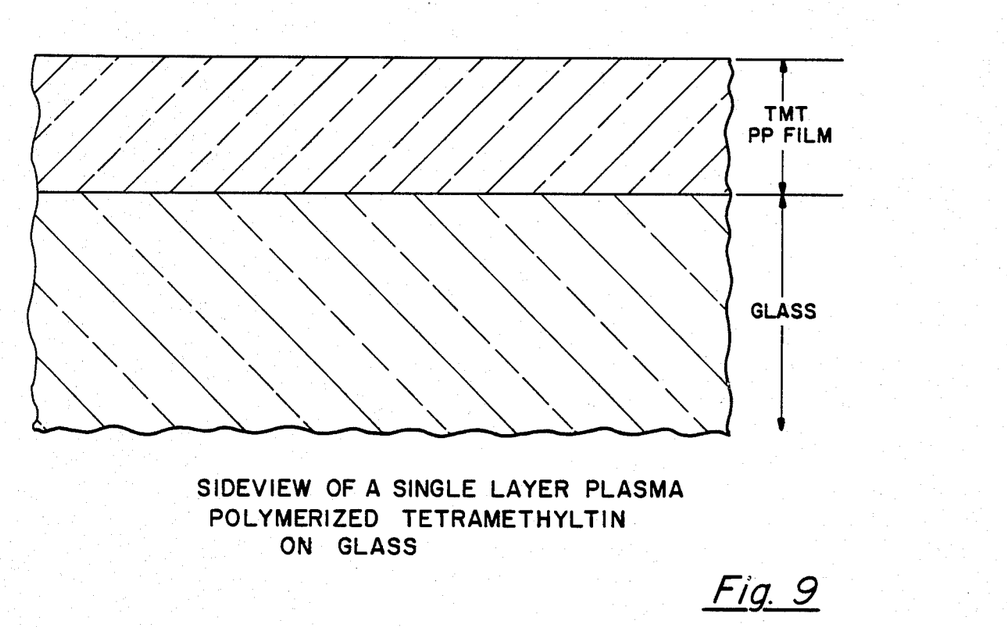
FIG. 9 is a side view of a single layer plasma polymerized tetramethyltin on glass.
Figure 10:
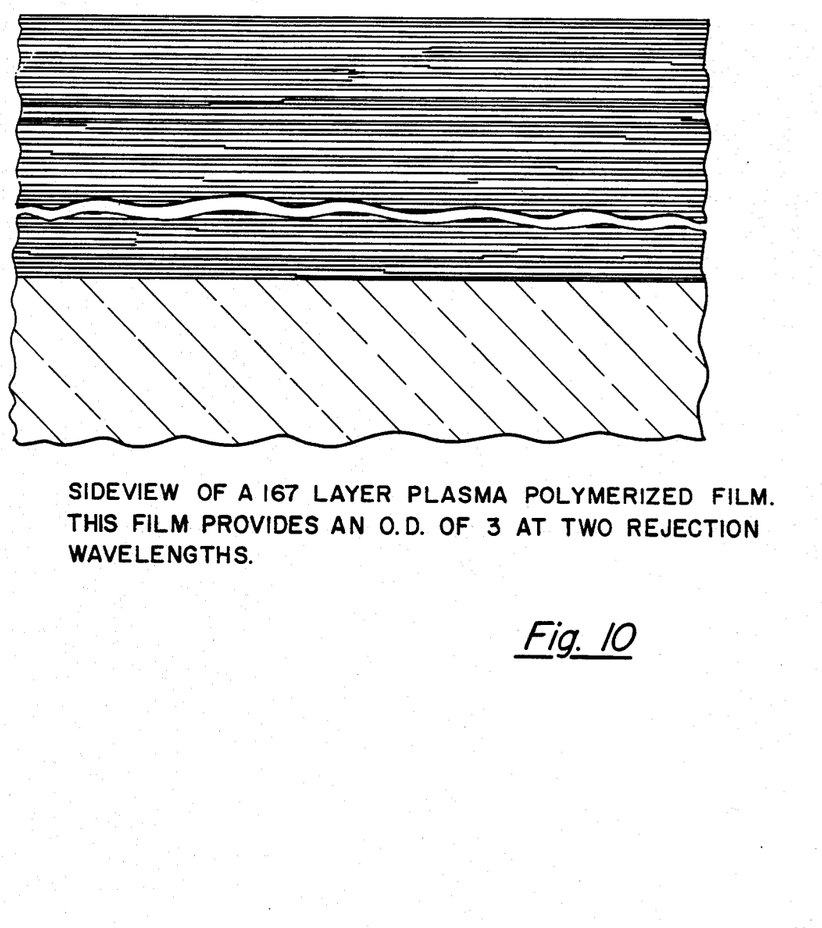
FIG. 10 is a side view of a multilayer plasma polymerized film.

FIG. 8-10 are scanning electron micrographs which reveal the unique microstructure of thin films formed from materials with plasma enhanced vapor deposition in system 10. FIG. 8 is of a cross section of film formed from hexamethyldiscloxane (HMDS). FIG. 9 is a similar cross sectional view of a film formed from tetramethyltin (TMT, i.e., M=Sn and R=(CH$_3$—)n=4). FIG. 10 is a cross section of a multilayer optical interference coating fabricated from two materials used for the films of FIGS. 8 and 9.

The above graphs reveal the films to be highly dense, glassy and amorphous, exhibiting none of the microvoid columnar structure typical of materials deposited by conventional techniques. The close-packed microstructure of the resulting films of the present invention, along with excellent optical performance and extreme mechanical flexibility (afforded by the organic phase- which imparts elastomeric qualities of the films) are unique to plasma enhanced chemical vapor deposition thin films produced from this class of materials.

While a particular embodiment of the invention has been shown and described, it will be obvious to those skilled in the art that alternatives, changes and modifications may be made without departing from the invention in its broader aspects.

The following is claimed:

1. An apparatus for applying high performance optical interference coatings to a polymeric substrate of complex curved topography comprising:
   first electrode means, having a surface with a contour matching a contour of a first side of said substrate that is juxtaposed to said first electrode means;
   second electrode means, which is a driven electrode, having a surface with a contour matching a contour of a second side of said substrate having orifices on the surface with the contour, and said second electrode means being proximate to the substrate and to said first electrode means, and said substrate being interposed between said first and second electrode means, for providing an electric field in conjunction with said first electrode means to excite a plasma;
   containing means for encompassing said first and second electrode means, encompassing the plasma, and encompassing a substrate feeding means connected to said second electrode means, for providing a substance through the orifices of said second electrode means, wherein said feeding means transports the substance through said driven electrode into said containing means subject to the electric field resulting in the plasma thereby allowing at least one thin film to be deposited on said substrate; and
   power means, connected to said first and second electrode means, for supplying energy for the electric field between said first and second electrode means.

2. Apparatus of claim 1 further comprising a reaction zone between said first and second electrode means.

3. Apparatus of claim 2 wherein said substance enters said reaction zone and results in a plasma enhanced chemical vapor deposition of said substance as at least one thin film upon said substrate.

4. Apparatus of claim 3 comprising:
   shield means, proximate to said first and second electrode means, for confining said substance within said reaction zone; and
   pump means, connected to said containing means, for removing certain gases and for maintaining a particular pressure within said containing means.

5. Apparatus of claim 4 wherein said feeding means further provides at least one inert gas into said reaction zone and at least one reactive agent into said reaction zone.

6. Apparatus of claim 5 wherein:
   said inert gas is a member selected from the group consisting of argon, xenon, neon, helium and krypton; and
   said reactive agent is one of a group including $O_2$, $N_2O$ and $H_2$.

7. Apparatus of claim 6 wherein said substance comprises a starting reactant in the form of M-R wherein M denotes a metal atom and R denotes an organic component, said substance which is deposited as a thin film upon said substrate in a reactive atmosphere, having said reactive agent, having a physical property from a group of properties ranging from the purely organic to the purely inorganic, and said physical property determined at least in part by a relative proportion of M and R.

8. Apparatus of claim 7 wherein the particular pressure is within a $10^{-3}$ to $10^{-2}$ torr range.

9. Apparatus of claim 8 further comprising monitoring means, within said chamber, for determining thickness of the thin film upon said substrate.

10. Apparatus of claim 9 wherein said monitoring means comprises:
    a light source positioned so as to transmit a light beam through an aperture of said second electrode means, through said reaction zone, through the thin film on said substrate, through said substrate, and through an aperture of said first electrode means; and
    a light sensor for detecting the light beam transmitted through the aperture of said first electrode means.

11. An apparatus for applying high performance multilayer optical interference coating to a polymeric substrate of complex curved topography comprising:
    a chamber;
    a passive electrode positioned inside said chamber;
    a driven electrode positioned inside said chamber, proximate to said passive electrode;
    a first power supply connected to said passive and driven electrodes; and
    a gas feed manifold connected to said driven electrode for transporting reactants through said driven electrode to said chamber for excitation into a plasma for depositing the optical interference coating to said substrate.

12. Apparatus of claim 11 further comprising:
    a first conductive plate positioned proximate to said first and second electrodes; and
    a second conductive plate positioned proximate to said passive and driven electrodes.

13. Apparatus of claim 12 further comprising:
    a second power supply connected to said passive electrode and to a reference voltage; and
    a third power supply connected to said driven electrode and to the reference voltage.

14. Apparatus of claim 13 wherein:
    said first power supply comprises a radio frequency generator;

said passive electrode has a surface with a contour such that the surface of said passive electrode matches a contour of a first side of the substrate; and said driven electrode has a surface with contour such that the surface of said passive electrode matches a contour of a second side of the substrate.

15. Apparatus of claim 14 wherein said driven electrode has on the surface with the contour a plurality of orifices connected to said gas feed manifold.

16. Apparatus of claim 15 further comprising a vacuum pump connected to said chamber.

17. Apparatus of claim 16 further comprising a monitor having a light source and a light detector, positioned such that a light beam from the light source goes through said driven electrode, said substrate, and passive electrode, via a first aperture in said driven electrode and a second aperture in said passive electrode, and impacts said light detector.

* * * * *